(12) United States Patent
Sugiyama et al.

(10) Patent No.: US 6,992,500 B2
(45) Date of Patent: Jan. 31, 2006

(54) PROBER AND PROBE TESTING METHOD FOR TEMPERATURE-CONTROLLING OBJECT TO BE TESTED

(75) Inventors: Masahiko Sugiyama, Nirasaki (JP); Yoshinori Inoue, Fuchu (JP)

(73) Assignee: Tokyo Electronic Limited, Tokyo (JP)

( * ) Notice: Subject to any disclaimer, the term of this patent is extended or adjusted under 35 U.S.C. 154(b) by 0 days.

(21) Appl. No.: 10/869,932

(22) Filed: Jun. 18, 2004

(65) Prior Publication Data

US 2004/0227536 A1    Nov. 18, 2004

Related U.S. Application Data

(63) Continuation of application No. PCT/JP03/09457, filed on Jul. 25, 2003.

(30) Foreign Application Priority Data

Oct. 21, 2002   (JP)   ............................. 2002-305925

(51) Int. Cl.
   *G01R 31/26*   (2006.01)

(52) U.S. Cl. .................................................. 324/765

(58) Field of Classification Search ................ 324/765, 324/760, 158.1; 219/520, 532–534, 542–548; 165/80.1–80.5; 118/724–725
See application file for complete search history.

(56) References Cited

U.S. PATENT DOCUMENTS

| | | | | |
|---|---|---|---|---|
| 5,966,940 A | * | 10/1999 | Gower et al. | ................. 62/3.3 |
| 6,032,724 A | * | 3/2000 | Hatta | ........................ 165/80.2 |
| 6,084,419 A | * | 7/2000 | Sato et al. | ................... 324/754 |
| 6,140,828 A | * | 10/2000 | Iino et al. | .................... 324/758 |
| 6,323,663 B1 | * | 11/2001 | Nakata et al. | ............... 324/754 |
| 6,452,137 B1 | * | 9/2002 | Kariya | ........................ 219/544 |
| 6,549,026 B1 | * | 4/2003 | DiBattista et al. | .......... 324/760 |
| 6,552,561 B2 | * | 4/2003 | Olsen et al. | ................. 324/760 |
| 6,583,638 B2 | * | 6/2003 | Costello et al. | ............. 324/760 |
| 2002/0011854 A1 | | 1/2002 | Kuji et al. | |

FOREIGN PATENT DOCUMENTS

| | | | |
|---|---|---|---|
| JP | 5-136229 | | 6/1993 |
| JP | 7-221144 | | 8/1995 |
| JP | 09159733 A | * | 6/1997 |
| JP | 9-186112 | | 7/1997 |
| JP | 2000-77488 | | 3/2000 |
| JP | 2001-210683 | | 8/2001 |
| JP | 2001-230308 | | 8/2001 |
| JP | 2002-280430 | | 9/2002 |

* cited by examiner

*Primary Examiner*—Jermele Hollington
(74) *Attorney, Agent, or Firm*—Oblon, Spivak, McClelland, Maier & Neustadt, P.C.

(57) ABSTRACT

A prober which tests an object to be tested under temperature control is provided. This prober includes a stage base, Z stage, X-Y stage having a frame structure, substrate fixing mechanism arranged on the X-Y stage, a probe card arranged to oppose the substrate fixing mechanism, and a probing stage fixed on the Z stage and arranged in the frame structure of the X-Y stage such that its axis coincides with an extension line vertically extending from the probe center of the probe card. The probing stage includes a probing elevating mechanism, and a temperature controller to heat and cool the object to be tested. The probing stage supports the substrate of the object to be tested from the bottom surface, and controls the temperature of the object to be tested.

4 Claims, 12 Drawing Sheets

PROBER AND PROBE TESTING METHOD FOR TEMPERATURE-CONTROLLING OBJECT TO BE TESTED

CROSS-REFERENCE TO RELATED APPLICATIONS

This is a Continuation Application of PCT Application No. PCT/JP03/09457, filed Jul. 25, 2003, which was not published under PCT Article 21(2) in English.

This application is based upon and claims the benefit of priority from prior Japanese Patent Application No. 2002-305925, filed Oct. 21, 2002, the entire contents of which are incorporated herein by reference.

BACKGROUND OF THE INVENTION

1. Field of the Invention

The present invention relates to a prober and probe testing method which test an object to be tested generally arranged on a wafer-like substrate under temperature control and, more particularly, to a prober and probe testing method that test the electrical characteristics of an object to be tested more accurately.

2. Description of the Related Art

When the electrical characteristics of an integrated circuit, a liquid crystal display, or the like arranged on a wafer-like substrate (to be referred to as a "wafer" hereinafter) such as a silicon substrate are to be tested, a prober is used. As shown in FIG. 13, a conventional prober has a probe card 14, a plurality of probes 26 provided on the probe card, a main chuck 6 to receive a wafer W thereon, a moving mechanism 12 to move the main chuck in X, Y, Z, and θ directions, upper and lower cameras 39 and 38 to align the object to be tested with the probe card, a test head TH, a tester T, and the like. The main chuck 6 has a holding mechanism which can be moved three-dimensionally by the moving mechanism 12 and which holds the wafer W.

Some main chuck 6 of the prober can control the temperature of the object to be tested which is to be measured to a predetermined temperature. With this control, temperature conditions for measurement can be changed. Hence, the test is performed in an environment similar to that where the object to be tested is to be actually used. As such a prober, patent reference 1 discloses an apparatus that controls the temperature of a heating resistor provided in a main chuck on the basis of the temperature of the main chuck detected by a temperature detecting means provided at the center of the main chuck. According to patent reference 1, this test can be performed at a highly accurate temperature by controlling the temperatures of the heating resistor divided into a plurality of zones.

Patent reference 2 discloses an apparatus that includes the stage surface of a main chuck divided into a plurality of regions, grooves respectively formed in the divisional regions, supply/discharge channels open to the grooves, a supply source, switchably connected to the supply/discharge channels, of a fluid having high thermal conductivity, and an evacuation means. This prober has a structure which performs heat exchange by supplying a fluid having high thermal conductivity and chucks and holds a wafer by vacuum.

In the above prober, a comparatively large area of the main chuck is heated or cooled. It is accordingly difficult to control the temperature of each object to be tested separately. This prober has a high energy consumption. This prober also takes a long time for temperature control.

Usually, in a test using probes, probes apply a high needle pressure to a wafer placed on a main chuck. In the conventional prober, when testing an object to be tested which is arranged on the periphery of a wafer, the main chuck 6 tilts because of the needle pressure as exaggeratedly indicated by the alternate long- and short-dashed line in FIG. 14, so that a probe may not come into contact with a predetermined position on the wafer.

[Patent Reference 1]
  Jpn. Pat. Appln. KOKAI Publication No. 9-186112

[Patent Reference 2]
  Jpn. Pat. Appln. KOKAI Publication No. 2001-230308

BRIEF SUMMARY OF THE INVENTION

It is an object of the present invention according to one aspect of the present application to provide a prober and probing method that can accurately perform temperature control of an object to be tested in a probe test.

It is an object of the present invention according to another aspect of the present application to provide a prober and probing method that can perform a probing test quickly and efficiently.

It is an object of the present invention according to still another aspect of the present application to provide a prober that prevents the main chuck from being tilted by a pressure applied by a probe.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to one aspect of the present invention, there is provided a prober for testing a plurality of objects to be tested which are arranged on a wafer-like substrate under temperature control, comprising a prober chamber, a stage base arranged in the prober chamber, an X-Y stage arranged on the stage base (the X-Y stage including an X-Y stage driving mechanism to move the X-Y stage at least in the X-Y direction), a Z stage arranged on the X-Y stage (the Z stage including a Z stage elevating mechanism to vertically move the Z stage), a main chuck arranged on the Z stage (the main chuck including a rotational driving mechanism to rotate the main chuck in the θ direction, a plurality of heaters, a heat exchanger, and a temperature controller, the plurality of heaters respectively having sizes suitable to heat either the plurality of objects to be tested or a group including the plurality of objects to be tested, and the plurality of heaters respectively including temperature sensors, the heat exchanger serving to cool the objects to be tested which are heated by the plurality of heaters, the temperature controller serving to control at least either the heaters or heat exchanger on the basis of the detection results of the temperature sensors), and a probe card (the probe card being arranged in the prober chamber to oppose the wafer-like substrate and having a plurality of probes).

The prober according to the above aspect of the present invention can comprise any one of the following further preferred arrangements, or a combination of some of the following further preferred arrangements.

The plurality of heaters have either cell structures respectively corresponding to the plurality of objects to be tested, or cell structures respectively corresponding to the group including the plurality of objects to be tested, the cell structures include individual heat exchangers, and the temperature controller controls at least either the heaters or heat exchanger, thus controlling temperatures of the cell structures.

The plurality of cell structures include heat insulators to partition respective cells from each other.

The main chuck is arranged on the Z stage through a θ stage, and the rotational driving mechanism rotates the main chuck in the θ direction on the θ stage.

According to another aspect of the present invention, there is provided a prober for testing a plurality of objects to be tested which are arranged on a wafer-like substrate, comprising a prober chamber, a stage base arranged in the prober chamber, a Z stage arranged on the stage base (the Z stage including a Z stage elevating mechanism to vertically move the Z stage), an X-Y stage arranged on the Z stage (the X-Y stage forming a first frame structure, having a first space at the center thereof, and including an X-Y driving mechanism to move the X-Y stage at least in the X and Y directions), a substrate fixing mechanism arranged on the X-Y stage (the substrate fixing mechanism forming a second frame structure and having a second space, at the center thereof, which is continuous to the first space), a probe card (the probe card being arranged in the probe chamber to oppose the main chuck in the prober chamber and having a plurality of probes), a probing stage elevating mechanism fixed on the Z stage, a probing stage attached to the probing stage elevating mechanism and arranged in the first space, the probing stage being arranged such that an axis thereof coincides with the extension line vertically extending from the probe center of the probe card, and an upper flat surface of the probing stage having a size smaller than the size of the first and second space, the upper flat surface serving to come into contact with the bottom surface of the substrate, when the probing stage is moved upward by the probing elevating mechanism, to support the substrate from below).

The prober according to the above aspect of the present invention can comprise any one of the following further preferred arrangements, or a combination of some of the following further preferred arrangements.

The size of the upper flat surface of the probing stage corresponds to a region occupied by the distal ends of the plurality of probes of the probe card.

The size of the upper flat surface of the probing stage corresponds to the size of one object to be tested.

The probing stage includes a heater to heat at least one object to be tested, among the plurality of objects to be tested, with which the plurality of probes of the probe card come into electrical contact, and a temperature sensor to measure at least the temperatures of the objects to be tested and the temperature of the heater.

The probing stage further includes a heat exchanger to cool the object to be tested.

The substrate fixing mechanism includes a chuck plate, chuck plate fixing mechanism, and rotational driving mechanism to rotate the chuck plate fixing mechanism in the θ direction.

The probing stage is detachably attached to the probing stage elevating mechanism.

The chuck plate is detachably attached to the chuck plate fixing mechanism.

The X-Y stage driving mechanism includes an X-Y stage moving mechanism which moves the X-Y stage on the Z stage in at least the X-Y direction, and an X-Y stage support mechanism which supports the X-Y stage to be smoothly movable on the Z stage.

The X-Y stage moving mechanism includes a linear motor mechanism.

The X-Y stage support mechanism includes an air bearing mechanism.

The chuck plate includes at least one of a plurality of fixing mechanisms to fix the substrate, a mechanism which draws and fixes the substrate by suction, and a ring mechanism to retain the substrate.

According to still another aspect of the present invention, there is provided a method of testing an object W to be tested in a prober, comprising (a) placing the object to be tested on the chuck plate, (b) moving the X-Y stage in the X and Y directions with the X-Y stage driving mechanism and rotating the wafer fixing mechanism with the rotational driving mechanism, thus aligning the probe card and the object to be tested and accordingly aligning the object to be tested with a chuck plate which is arranged such that an axis thereof always substantially coincides with the extension line vertically extending from the probe center of the probe card, (c) moving the probing stage upward with the probing stage elevating mechanism to bring the probing stage and the bottom surface of the wafer into contact with each other, (d) moving the Z stage upward in the Z direction with the Z stage elevating mechanism to bring the object to be tested into contact with the probes, (e) moving the Z stage further upward in the Z direction, thus overdriving the object to be tested, (f) testing the electrical characteristics of the object to be tested, (g) moving the probing stage downward in the Z direction with at least one of the Z stage elevating mechanism and probing stage elevating mechanism to separate the probes, the object to be tested, and the chuck plate from each other, and (h) repeating (b) to (g), thus testing all the electrical characteristics of a predetermined object to be tested.

This method further preferably comprises any one or a combination of the following arrangements.

In (f), the mechanism that overdrives the object to be tested is at least one of the Z stage elevating mechanism and probing stage elevating mechanism.

The probing stage includes a heater to heat an object to be tested, among the plurality of objects to be tested, with which the plurality of probes of the probe card come into electrical contact, and a temperature sensor to measure at least one of a temperature of the heater and the temperatures of the objects to be tested, and prior to (f) testing the electrical characteristics of the object to be tested, the object to be tested is maintained at a predetermined temperature by the heater and temperature sensor.

A heat exchanger to cool the object to be tested is further provided, and prior to (f) testing the electrical characteristics of the object to be tested, the object to be tested is maintained at a predetermined temperature by the heater, temperature sensor, and heat exchanger.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

BRIEF DESCRIPTION OF THE SEVERAL VIEWS OF THE DRAWING

FIGS. 12A and 12B show still another example of the wafer fixing mechanism, in which FIG. 12A is a sectional view, and FIG. 12B shows a ring that fixes a wafer;

DETAILED DESCRIPTION OF THE INVENTION

Figure 1:
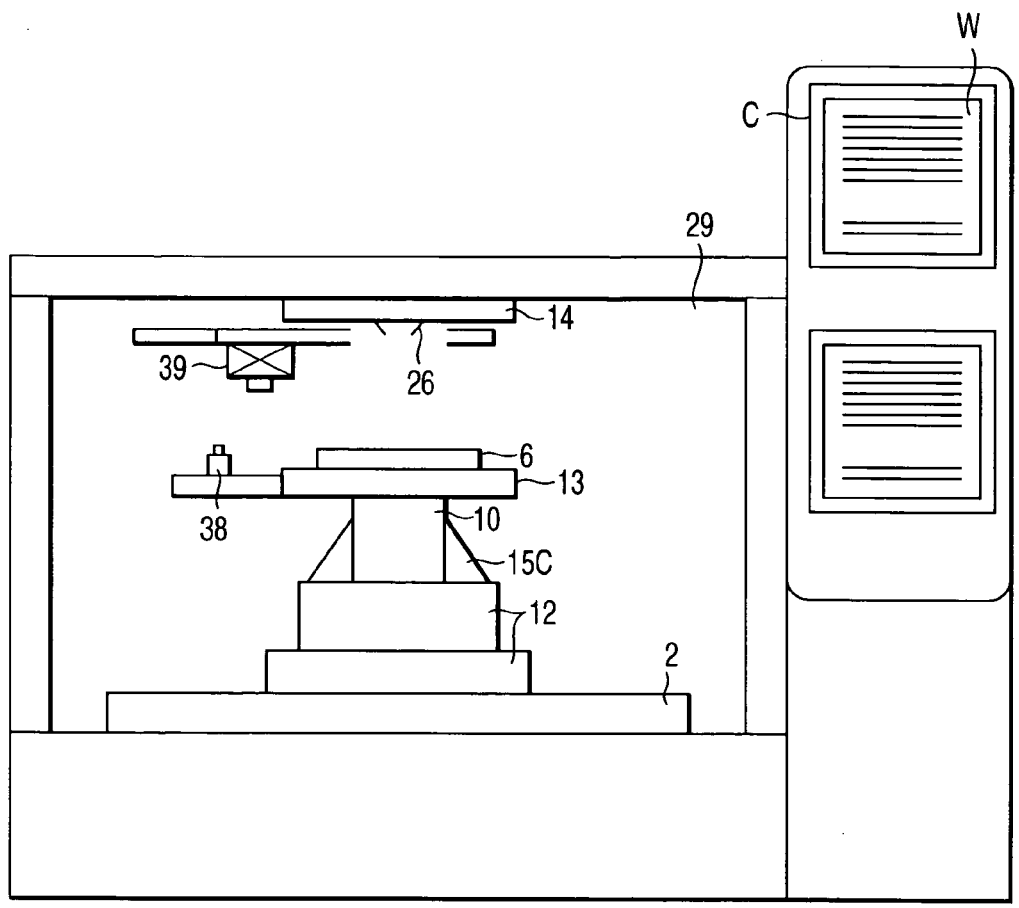
FIG. 1 shows a prober according to an embodiment of the present invention.

The embodiments of the present invention will be described with reference to the drawings. FIG. 1 is a sectional view of the main body of a prober 100 according to the first embodiment of the present invention. The prober 100 according to this embodiment has a prober chamber 29. A stage base 2 is arranged in the lower portion of the prober chamber 29. An X-Y stage 12, Z stage 10, and main chuck 6 are arrayed on the stage base in the Z direction. A probe card 14 can be arranged in the upper portion of the prober chamber 29 to oppose the main chuck 6. The probe card 14 has a plurality of probes 26. The electrical characteristics of an object to be tested which is placed on the main chuck 6 are tested by using the plurality of probes 26. In the present invention, the X-Y stage is a stage that can move in the X and Y directions. This stage may be a combination of a structure that moves in the X direction and a structure that moves in the Y direction, or may be a single structure that moves in both the X and Y directions.

Figure 2:
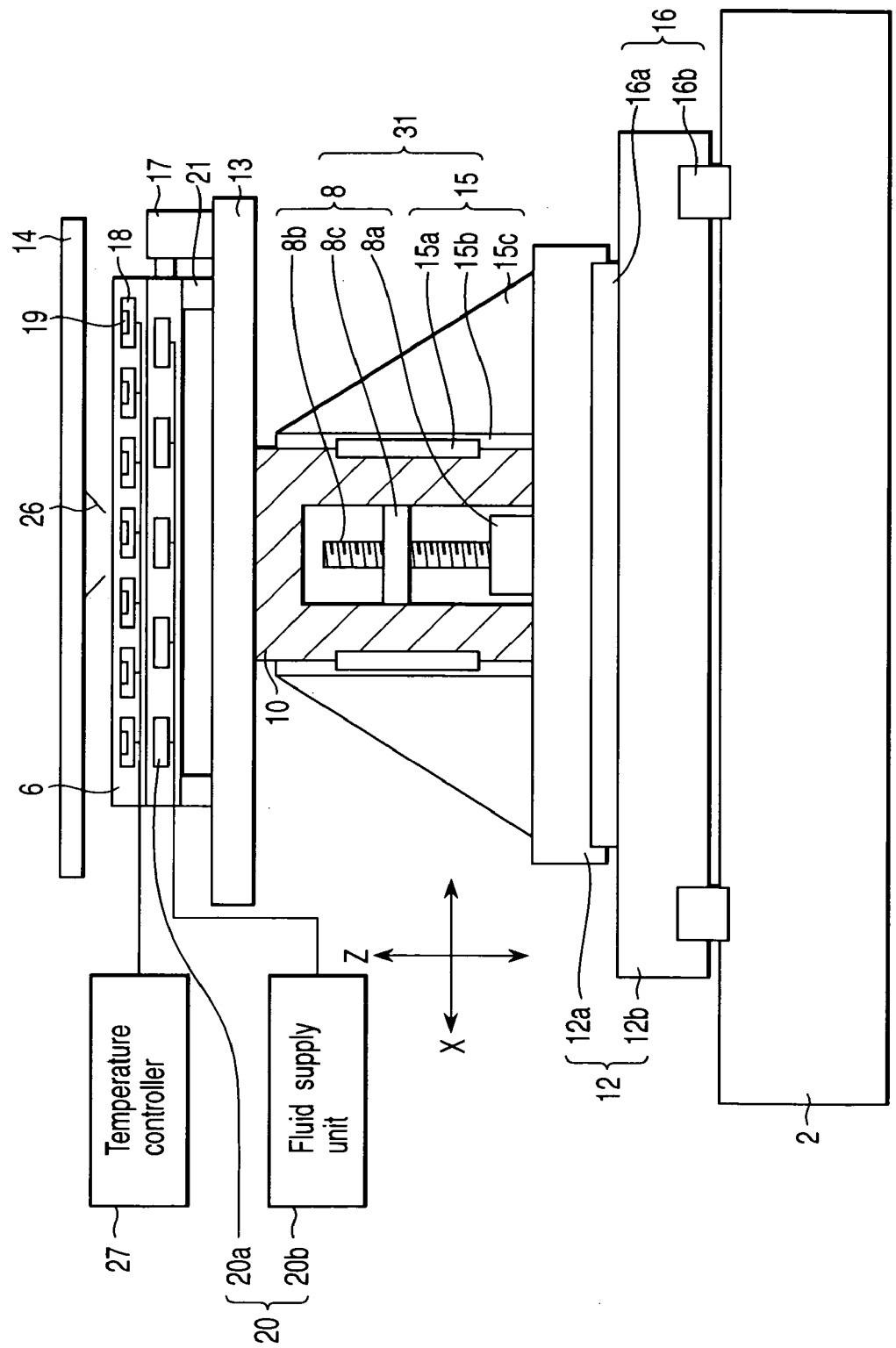
FIG. 2 shows the main body of the prober according to this embodiment.

FIG. 2 is an enlarged view of the main part of the prober in FIG. 1. The X-Y stage 12 is arranged on the stage base 2 through an X-Y stage driving mechanism 16. The X-Y stage 12 has an X stage 12a and Y stage 12b. The X-Y stage driving mechanism 16 has an X guide rail and driving mechanism 16a and Y guide rail and driving mechanism 16b. The X-Y stage 12 can be moved in the X and Y directions by the X-Y stage driving mechanism 16.

According to this embodiment, the Y stage 12b is attached to the stage base 2 through the Y guide rail and driving mechanism 16b, and can move along the Y guide rail. The X stage 12a is attached to the Y stage through the X guide rail and driving mechanism 16a, and can move along the X guide rail.

The Z stage 10 is attached to the X stage 12a through a Z stage elevating mechanism 31. The Z stage elevating mechanism 31 has a Z stage guide 15 and Z stage driving mechanism 8. The Z stage guide 15 can include a Z guide 15a which guides vertical movement of the Z stage, a Z guide rail 15b attached to the X-Y stage 12 parallel to the Z direction, and a reinforcing tool 15c which supports the Z guide rail 15b fixed to the X stage. The Z stage driving mechanism 8 can include, e.g., a motor 8a arranged on the X stage, a ball screw 8b rotationally driven by the motor, and a nut member 8c meshing with the ball screw 8b and fixed to the Z stage. When the motor 8a rotates the ball screw 8b, the nut member 8c moves vertically along the ball screw 8b. By this movement, the Z stage moves vertically along the Z guide rail 15b through the Z guide 15a. As the Z guide 15a, for example, a bearing can be used.

A θ stage 13 can be arranged on the Z stage. A rotational driving mechanism 17 can be arranged on the θ stage 13. Furthermore, the main chuck 6 to place a wafer thereon is arranged on the θ stage 13. The main chuck 6 is attached to the θ stage 13 through a θ guide rail 21, and is rotated along the θ guide rail 21 by the rotational driving mechanism 17. Although the rotational driving mechanism 17 is attached to the θ stage 13 in this embodiment, it may alternatively be attached to the Z stage directly. In this case, the θ stage 13 can be omitted, and the upper flat surface of the Z stage is preferably enlarged.

Figure 3:
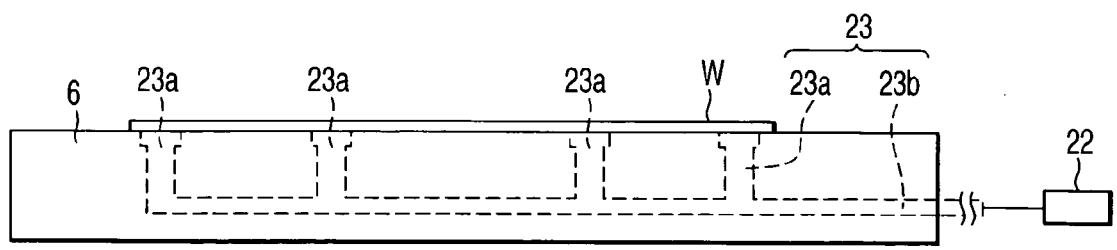
FIG. 3 shows an example of a wafer chucking/fixing mechanism.

The main chuck 6 can have a substrate fixing mechanism 23 to hold the wafer placed on it. FIG. 3 shows an example of the substrate fixing mechanism 23. Referring to FIG. 3, for example, the main chuck 6 has grooves 23a formed in its surface, and an air supply/exhaust pipe 23b connected to the grooves 23a. A vacuum pump 22 evacuates the grooves 23a through the air supply/exhaust pipe 23b, so that the wafer can be drawn by suction and fixed to the surface of the main chuck 6. As the substrate fixing mechanism, a chucking mechanism using static electricity, a mechanical fixing mechanism, or the like can be used instead.

Referring to FIG. 2, the main chuck 6 has a plurality of heaters 18 to heat objects to be tested which are on the wafer placed on the main chuck. Each heater can have a temperature sensor 19. Each heater has a size appropriate for heating one object to be tested or a group including a plurality of objects to be tested, and is arranged to correspond to the position of the object to be tested on the wafer. More specifically, one heater has a size corresponding to one object to be tested or one group which is placed, and is arranged such that one heater coincides with one object to be tested or a group of objects to be tested. Thus, one heater can accurately heat one object to be tested or a group of objects to be tested.

The main chuck 6 can further has a heat exchanger 20 to cool the object to be tested. The heat exchanger 20 includes a fluid supply/drain channel 20a and fluid supply unit 20b. A fluid having high thermal conductivity is circulated in the fluid supply/drain channel 20a, so that the object to be tested which is heated by the heater is cooled. When testing the electrical characteristics of, e.g., an integrated circuit which generates heat to reach a high temperature, the heat exchanger 20 can be used to prevent overheating of the object to be tested.

The prober according to this embodiment has a temperature controller 27. The temperature controller is connected to the respective heaters 18, respective temperature sensors 19, and heat exchanger 20. The temperature controller 27 controls at least either the heaters or heat exchanger on the basis of the detection results of the temperature sensors 19, so that the object to be tested can be set to a predetermined temperature.

Figure 4:
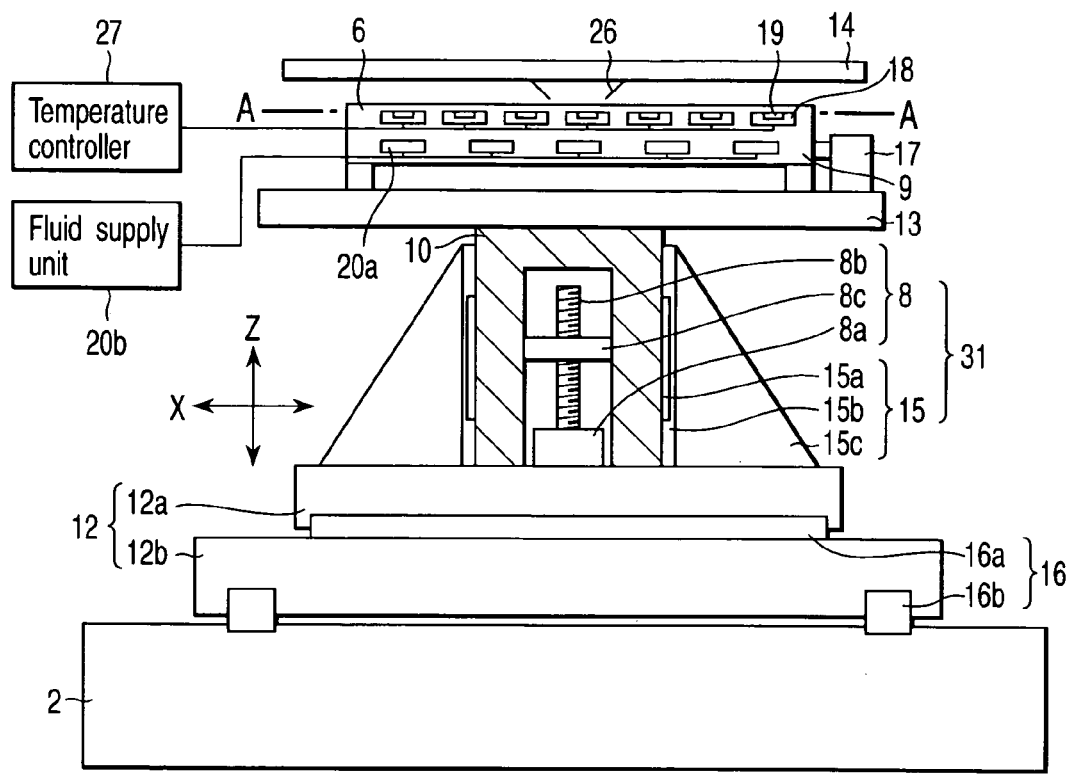
FIG. 4 shows the main part of a prober according to another embodiment of the present invention.

FIG. 4 shows the main part of a prober 100 according to the second embodiment of the present invention. According to the second embodiment, in addition to the prober 100 of the first embodiment, heaters provided to the main chuck have cell structures 9. A heater, temperature sensor, and heat exchanger can be arranged in each cell structure 9. A temperature controller 27 is connected to heaters 18, temperature sensors 19, and heat exchangers 20 of the respective cells, and can control the temperatures of the cells separately on the basis of the detection results of the temperature sensors.

Figure 5:
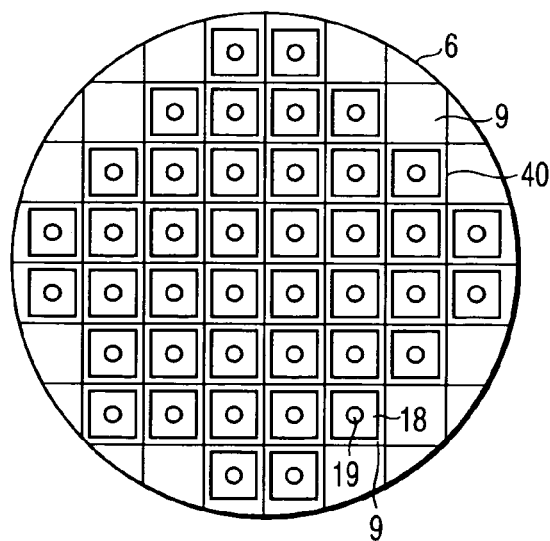
FIG. 5 is a cross-sectional view of a main chuck 6 taken along the line A—A of FIG. 4.

FIG. 5 shows a cross-section of a main chuck 6 taken along the line A—A of FIG. 4. The cell structures 9 are preferably arranged to correspond to the positions of the objects to be tested or the positions of a group including a plurality of objects to be tested, which are placed on the main chuck 6. More specifically, one or a plurality of cells are arranged to coincide with one or a group of objects to be tested placed on the main chuck. Since the heater, temperature sensor, and heat exchanger are arranged in each cell, one or a group of objects to be tested can be heated or cooled accurately. Furthermore, the respective cell structures 9 have heat insulators 40 to partition themselves from each other. Thus, the object to be tested can be controlled to a predetermined temperature in an environment that is not easily influenced by the temperature of an adjacent cell.

The operations of the first and second embodiments will be described. Referring to FIG. 1, a wafer W extracted from a cassette C by a transporting mechanism (not shown) is moved onto the main chuck 6 and placed there. The substrate fixing mechanism 23 described above fixes the wafer, and after that the wafer is aligned by using the upper and lower cameras 39 and 38 provided in the prober chamber 29. Wafer alignment is performed by moving the Y stage 12b along the Y guide rail 16b and the X stage 12a along the X guide rail 16a. The wafer is aligned in the θ direction almost simultaneous with alignment in the X and Y directions. Alignment in the θ direction is performed as the rotational driving mechanism 17 rotates the main chuck 6 along the θ guide rail 21.

When wafer alignment is ended and the Z stage 10 moves upward, the probes come into contact with the wafer. After this contact, the Z stage is moved further upward, and the test is started in the overdriven state. Temperature control of the object to be tested by the temperature controller is started immediately before the test or during alignment. When the object to be tested reaches a predetermined temperature, its electrical characteristics are tested by using the probes.

Figure 6:
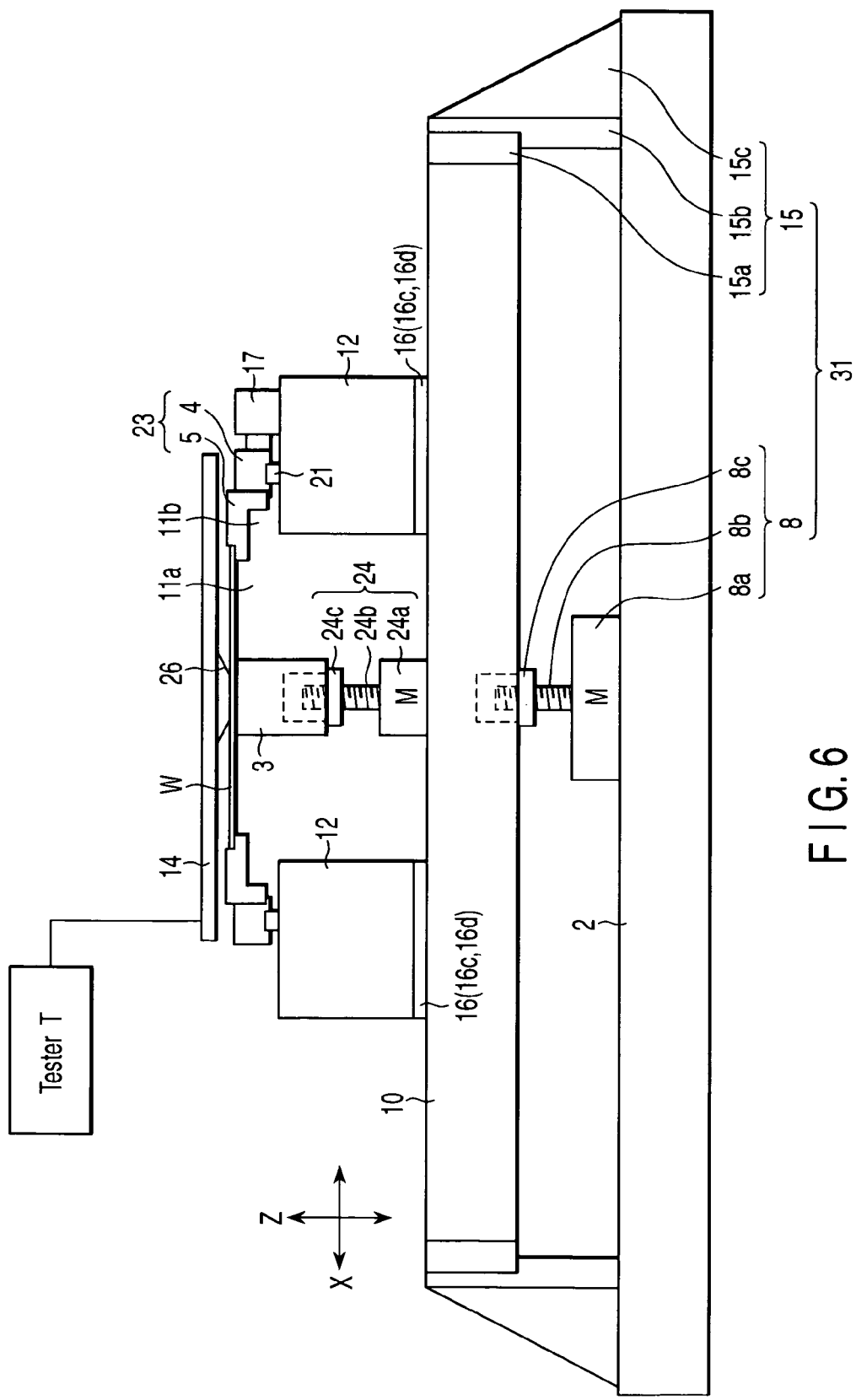
FIG. 6 shows the main part of a prober according to still another embodiment of the present invention.
Figure 7:
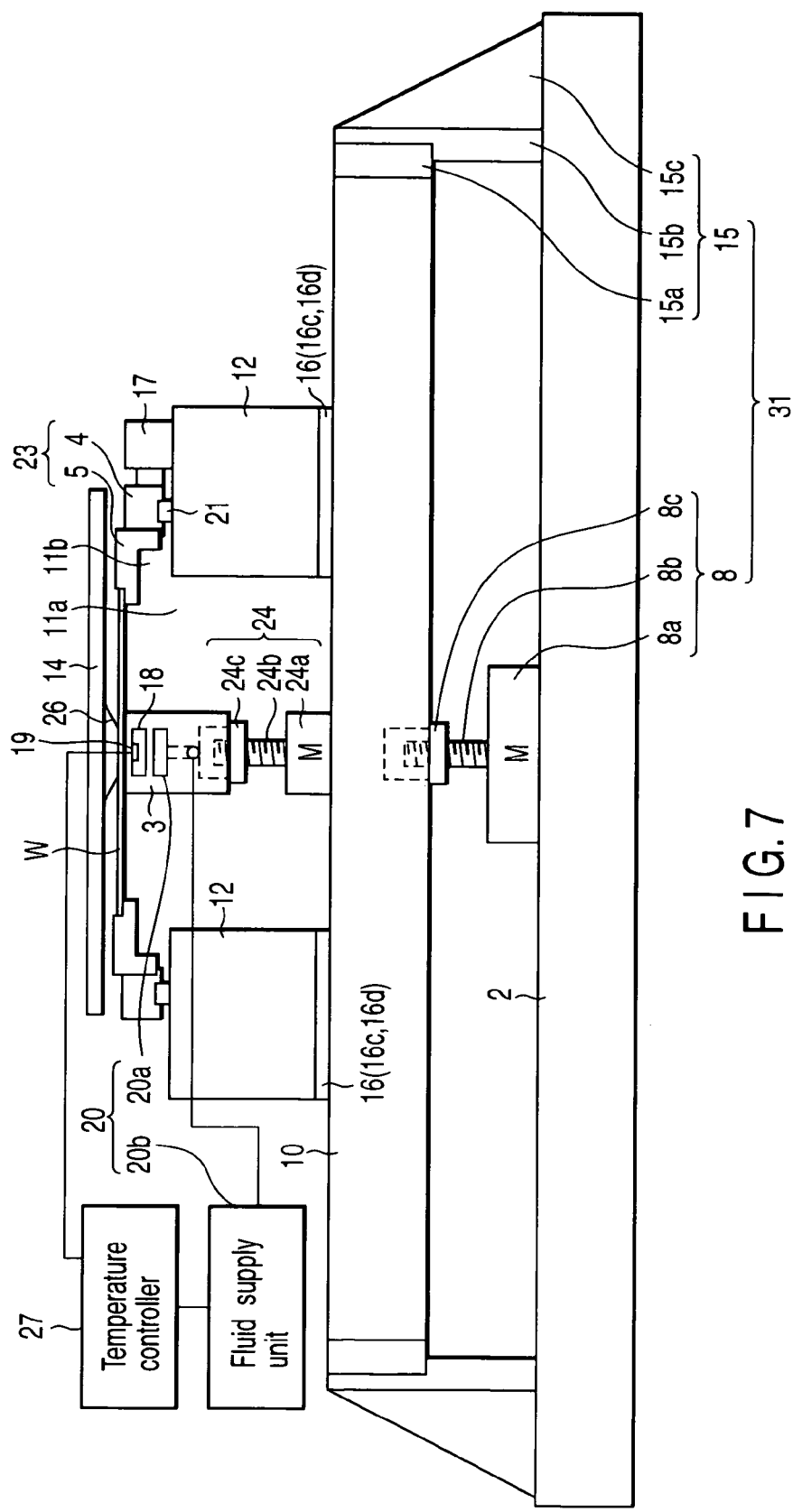
FIG. 7 shows the main part of a prober according to still another embodiment of the present invention.
Figure 8:
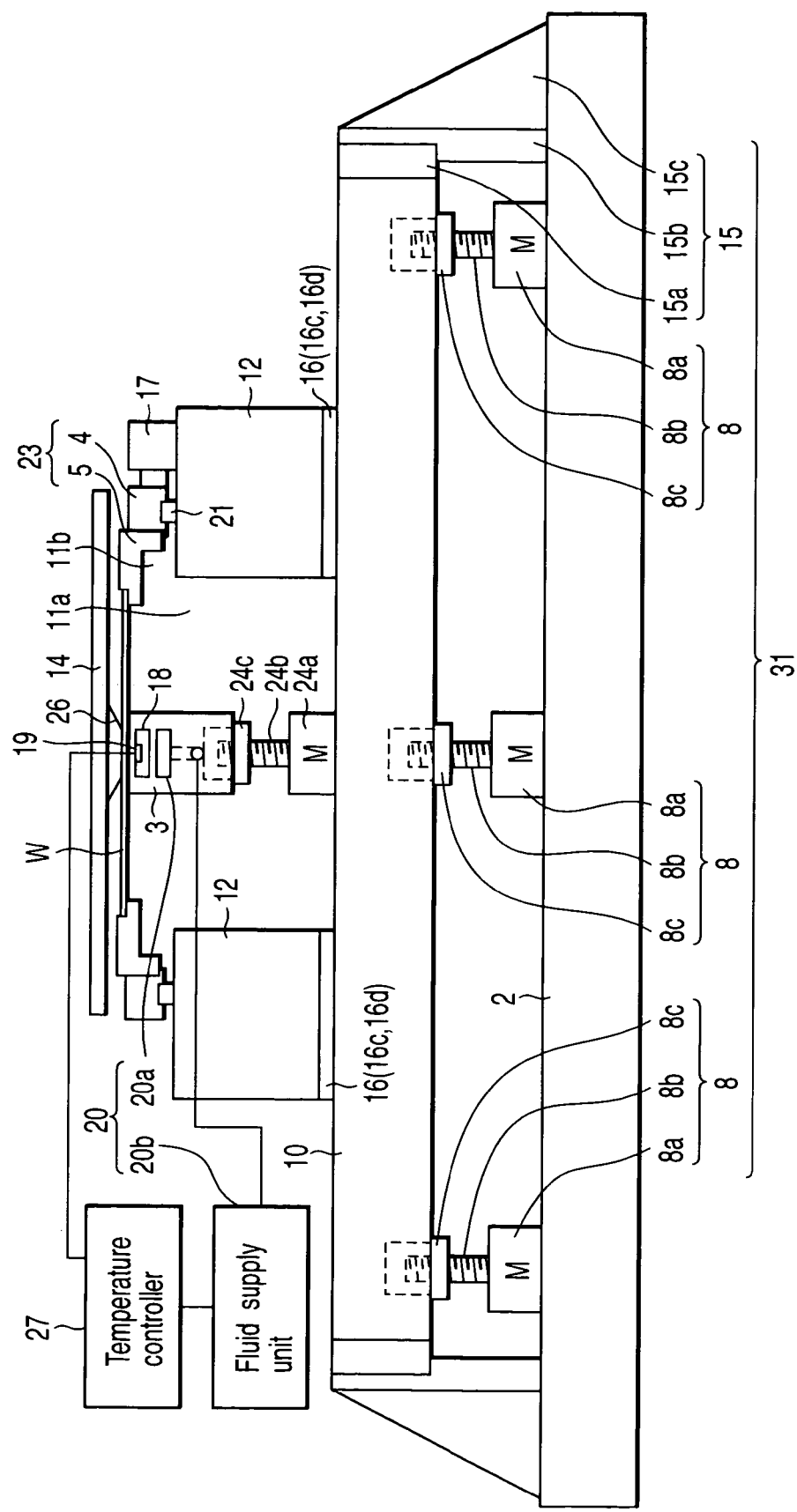
FIG. 8 shows another example of the main part of the prober according to this embodiment.
Figure 9:
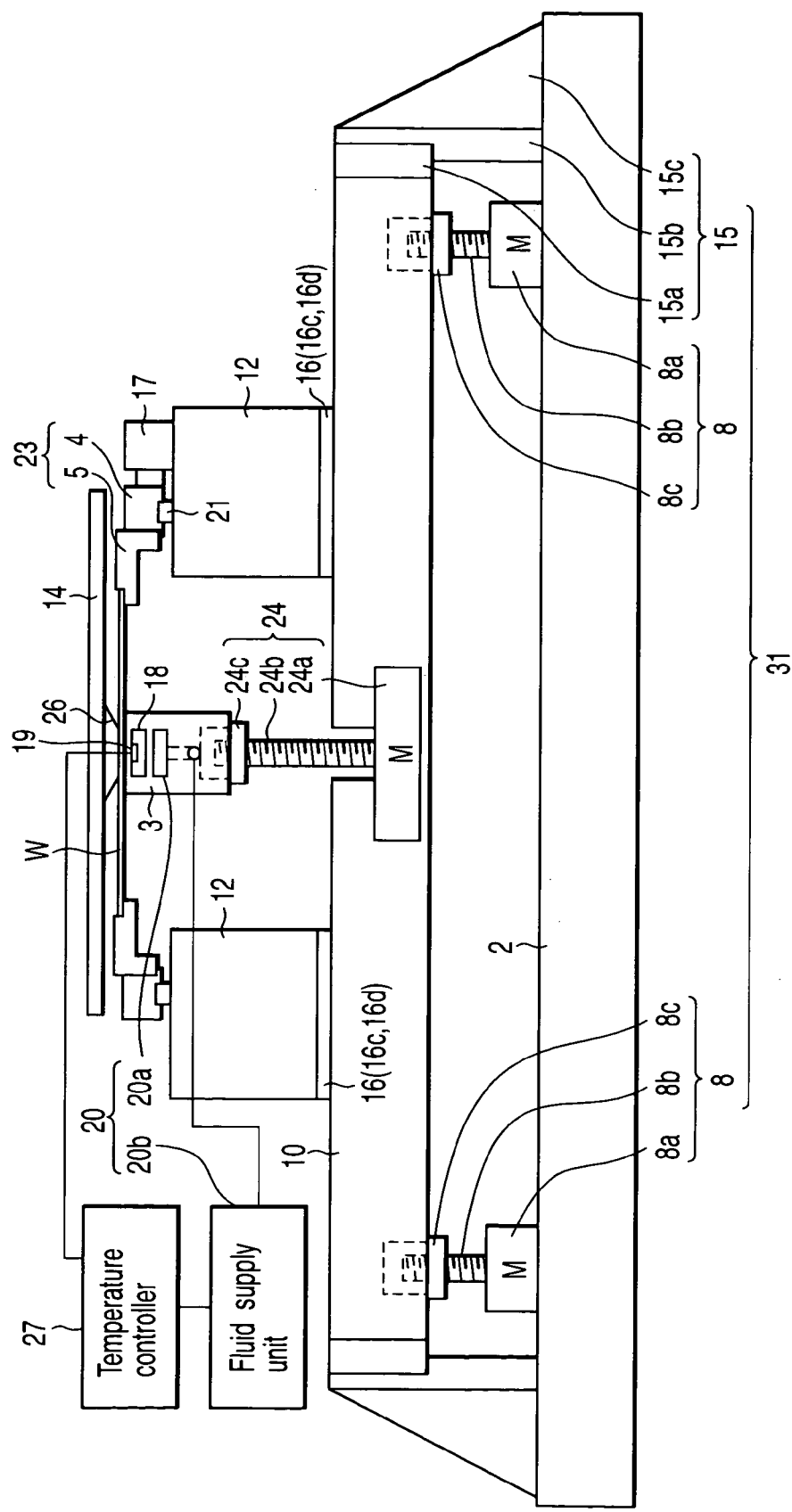
FIG. 9 shows still another example of the main part of the prober according to this embodiment.

FIG. 6 shows the main part of a prober 100 according to the third embodiment of the present invention. In the prober according to the third embodiment, a stage base 2 is arranged at the lower portion of a prober chamber 29, and a Z stage 10 is attached to the stage base 2 through a Z stage elevating mechanism 31. The Z stage elevating mechanism 31 can be arranged on the stage base 2, unlike in the first embodiment. Except for this, the arrangement and operation of the third embodiment are the same as those of the first embodiment. One Z stage driving mechanism 8 that forms the Z stage elevating mechanism 31 may be arranged at the center of the stage base 2 as shown in FIGS. 6 and 7. Alternatively, a plurality of Z stage driving mechanisms 8 may be arranged as shown in FIGS. 8 and 9.

Referring to FIG. 6, an X-Y stage 12 is arranged on the Z stage 10. The X-Y stage has an X-Y stage driving mechanism 16, and can move on the Z stage in the X and Y directions. The X-Y stage driving mechanism 16 can include an X-Y stage moving mechanism 16c which moves the X-Y stage on the Z stage in the X-Y direction, and an X-Y stage support mechanism 16d which supports the X-Y stage to be smoothly movable on the Z stage. As the X-Y stage moving mechanism 16c, for example, a linear motor mechanism can be employed. As the X-Y stage support mechanism 16d, for example, an air bearing mechanism can be employed. The X-Y stage driving mechanism 16 may be provided between the Z stage and X-Y stage. Alternatively, X-Y stage driving mechanisms 16 may be built into and formed integral with the Z stage and X-Y stage, respectively. According to this embodiment, as the X-Y stage driving mechanism 16, an LMSP manufactured by HIWIN CORPORATION can be improved and employed. The LMSP is a linear motor type control system including an air bearing. The stage driving mechanism 16 employing the LMSP blows compressed air from the lower surface of its stage, so that the stage may be slightly levitated and supported. In this state, the linear motor mechanism provided to the stage moves the stage in the X and Y directions.

The X-Y stage 12 has a frame structure with a space at its center, which can be defined as the first frame structure. The space at the center of the first frame structure can be defined as a first space 11a. The first frame structure is particularly preferably an annular structure. A substrate fixing mechanism 23 to hold the wafer is arranged on the X-Y stage 12. The substrate fixing mechanism 23 also has a frame structure, which can be defined as the second frame structure. The space at the center of the second frame structure and continuous to the first space can be defined as a second space 11b. The substrate fixing mechanism 23 can include a chuck plate 5 which holds the wafer such that it is held at the position covering the second space 11b, and a chuck plate fixing mechanism 4 to which the chuck plate is fixed. Both the chuck plate 5 and chuck plate fixing mechanism 4, or at least the chuck plate 5 preferably has a frame structure, and particularly preferably an annular structure. The chuck plate fixing mechanism 4 can be attached to the X-Y stage through a θ guide rail 21, and can be rotated in the θ direction by a rotational driving mechanism 17 which is also arranged on the X-Y stage.

Figure 10:
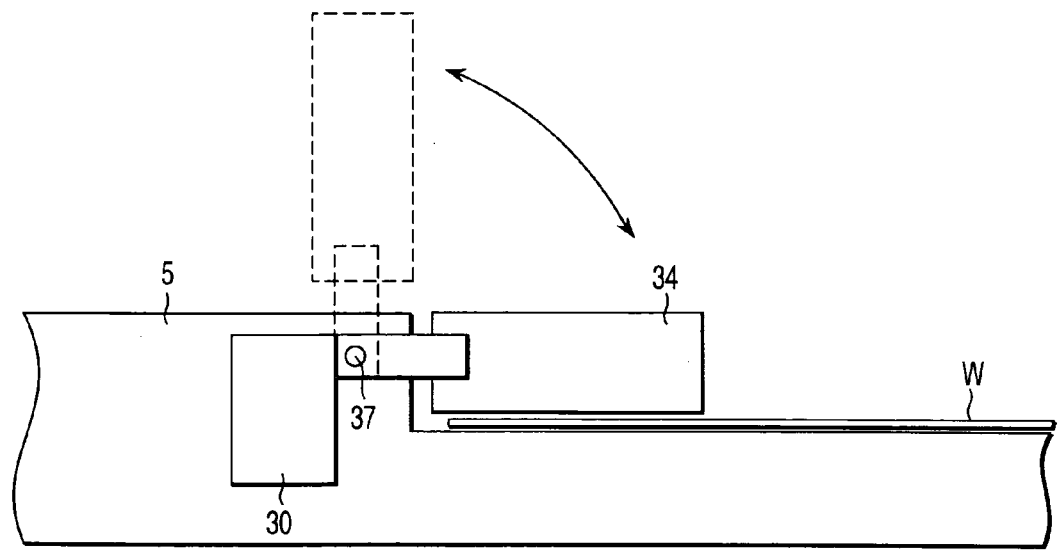
FIG. 10 shows an example of a wafer fixing mechanism.
Figure 11:
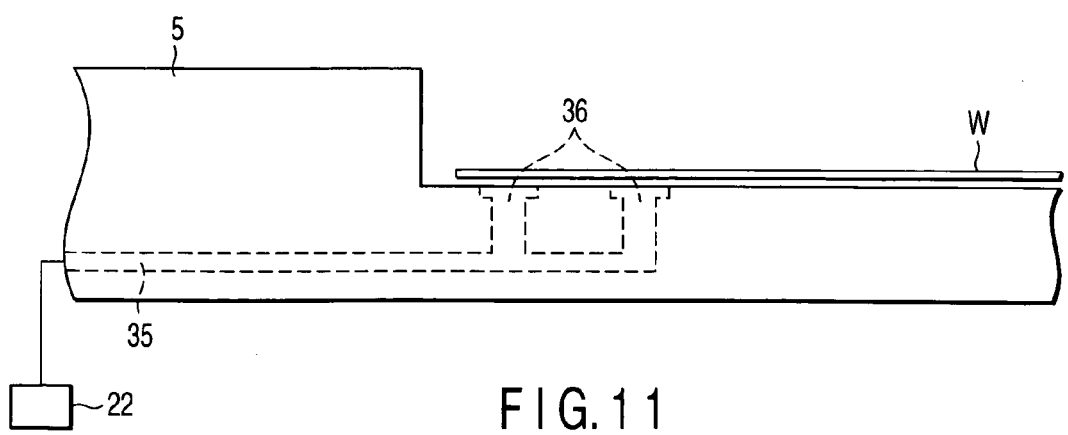
FIG. 11 shows another example of the wafer fixing mechanism.

A wafer W is held by the chuck plate 5. The chuck plate 5 has a structure to hold the wafer W. FIGS. 10 to 12B show examples of the structure of the chuck plate 5. FIG. 10 shows an example of the chuck plate. A retainer 34 rotatably attached to the chuck plate with a hinge 37 fixes the wafer placed on the chuck plate. The retainer 34 can be vertically moved manually, or automatically. If the retainer 34 is vertically moved automatically, while the retainer 34 is lifted by a driving mechanism 30, a wafer is placed on the chuck plate 5. Subsequently, the driving mechanism lowers the retainer, so that the wafer may be fixed. Retainers 34 can be arranged at a plurality of portions of the chuck plate 5. FIG. 11 shows another example of the chuck plate 5. The chuck plate 5 has suction/exhaust ports 36 and a suction/exhaust pipe 35 in it. While a wafer is placed on the chuck plate, a vacuum pump 22 evacuates from the suction/exhaust ports 36 and suction/exhaust pipe 35, so that the wafer can be drawn by suction and fixed to the chuck plate.

Figure 12A:
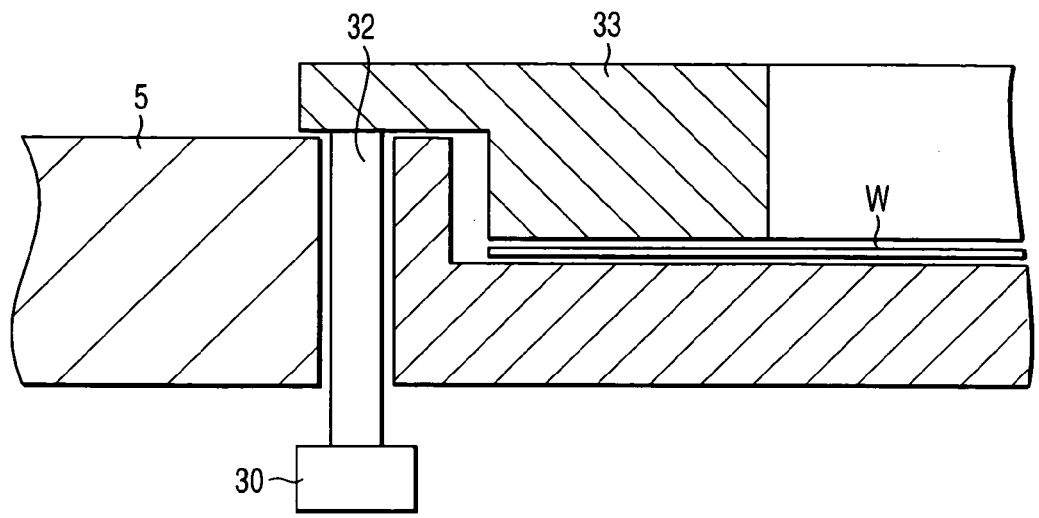
Figure 12B:
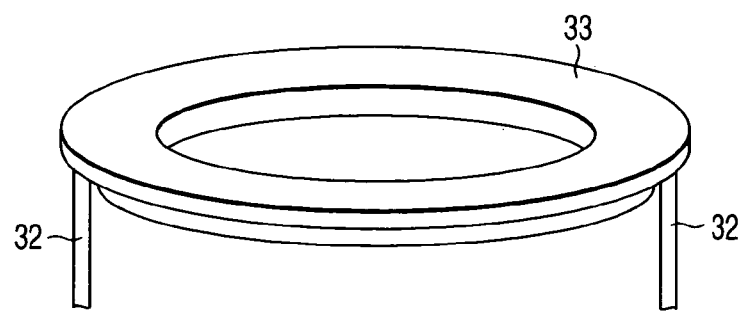
Figure 13:
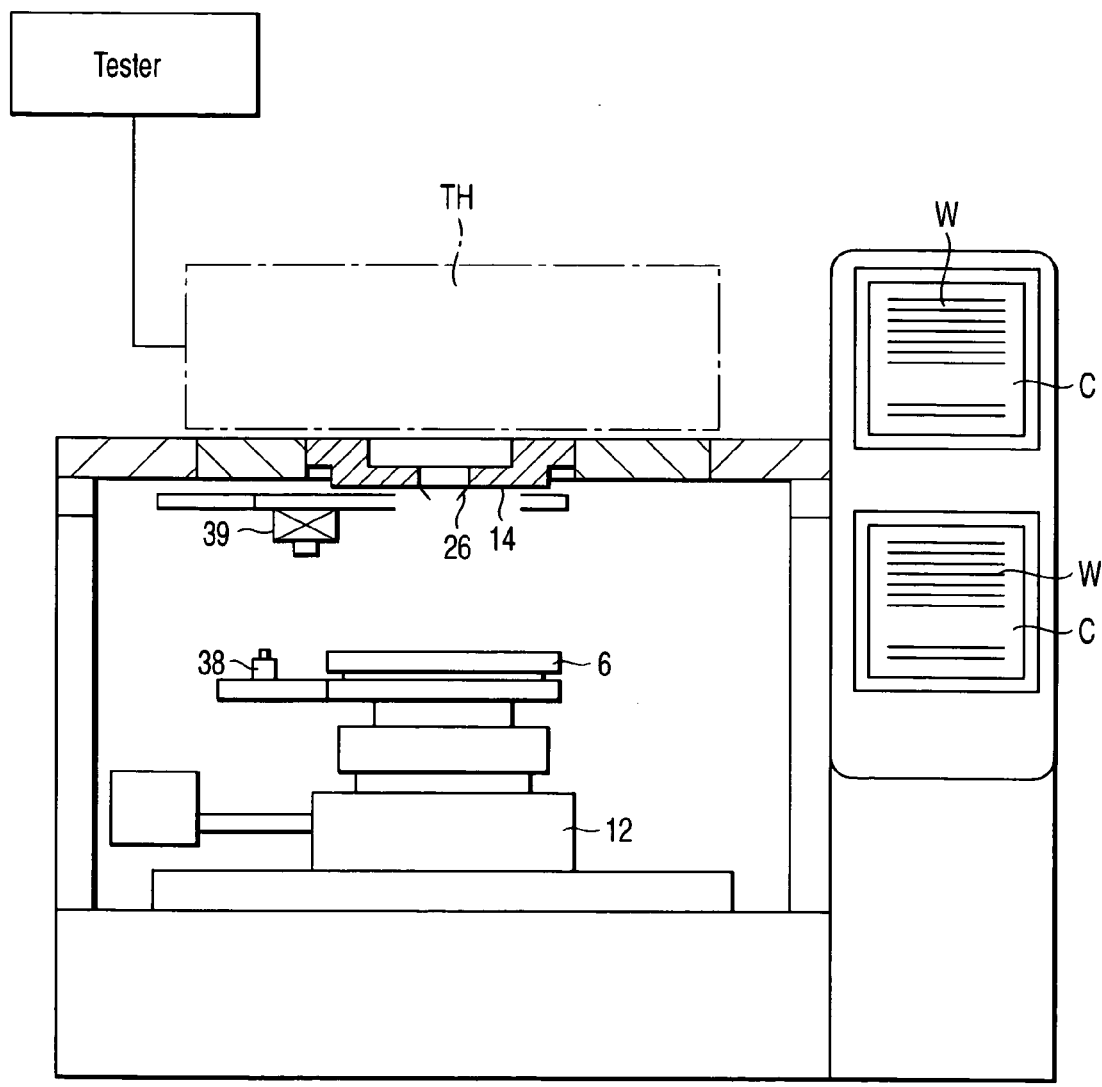
FIG. 13 shows a conventional prober.
Figure 14:
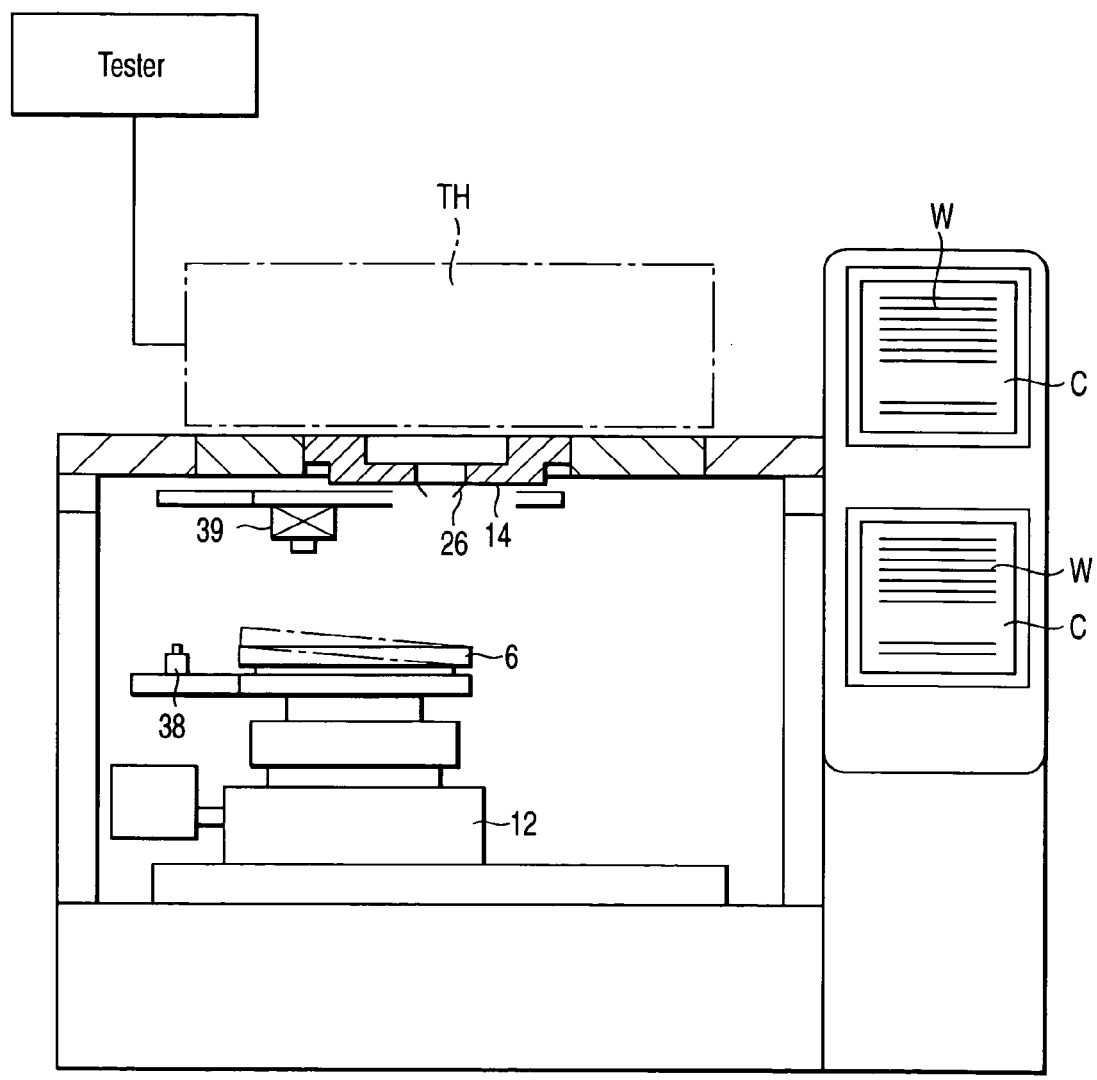
FIG. 14 is a schematic view showing the tilt of a main chuck in the conventional prober.

FIGS. 12A and 12B show still another example. A ring-like member 33 as shown in FIG. 12B fixes the wafer. The ring-like member 33 has support columns 32 at a plurality of portions, preferably two portions, on its periphery. The support columns 32 are arranged on the chuck plate 5 such that they can move vertically. FIG. 12A is a sectional view of the chuck plate 5 having the ring-like member 33. While the driving mechanism 30 lifts the support columns 32, a wafer is placed on the chuck plate 5. After that, the driving mechanism 30 lowers the support columns 32. Thus, the ring-like member 33 presses the wafer, so that the wafer can be fixed on the chuck plate.

In the plurality of examples described above, the chuck plate 5 is fixed to the chuck plate fixing mechanism 4. Alternatively, the chuck plate 5 can be detachably attached to the chuck plate fixing mechanism 4. In this case, the chuck plate 5, to which the wafer has been fixed in advance outside the prober, can be attached to the chuck plate fixing mechanism 4. A probe card 14 having a plurality of probes 26 is so arranged in the upper portion of the prober chamber as to oppose the wafer W placed on the chuck plate 5.

As shown in FIG. 6, in the first and second spaces 11a and 11b, a probing stage 3 is arranged on the Z stage. The probing stage 3 is preferably arranged such that its axis coincides with an extension line vertically extending from the probe center of the probe card 14. The probing stage 3 can have a probing stage elevating mechanism 24 at its lower portion to vertically move the probing stage 3. When the probing stage 3 is moved upward by the probing stage elevating mechanism, an upper flat surface 3a of the probing stage comes into contact with the bottom surface of the wafer W fixed to the chuck plate 5. The probing stage 3 supports the wafer from below, during probe testing, as it comes into contact with the wafer W. For this purpose, the upper portion of the probing stage 3 forms a flat surface. The size of the upper flat surface 3a of the probing stage 3 is smaller than that of the first and second space 11a and 11b, and is a size corresponding to the region occupied by the distal ends of the plurality of probes of the probe card, i.e., a maximum region that can be tested at once. The corresponding size signifies being larger than the prescribed region.

The probing stage elevating mechanism 24 moves the probing stage 3 vertically. The probing stage elevating mechanism 24 is fixed on the Z stage, and can include, e.g., a motor 24a, ball screw member 24b fixed to the motor 24a, and nut member 24c fixed to the probing stage 3. The ball screw member 24b threadably engages with the nut member 24c. When the motor 24a rotates the ball screw member 24b, the probing stage 3 moves vertically. The motor 24a can be arranged on the Z stage 10 as shown in FIGS. 6 to 8, or in the Z stage 10 as shown in FIG. 9.

The operation of the third embodiment will be described. Referring to FIG. 6, the wafer W extracted from a cassette C by a transport mechanism (not shown) is placed on the chuck plate 5(a). When the chuck plate 5 fixes the wafer, the aligning means described above and the X-Y stage driving mechanism 16 which moves the X-Y stage 12 in the X and Y directions align the object to be tested (b1). At this time, the probing stage 3 and its probing stage elevating mechanism 24 do not move, as they are fixed to the Z stage 10. Subsequently, the rotational driving mechanism 17 cooperates with the aligning mechanism, while rotating the substrate fixing mechanism 23, to determine the position in the θ direction (b2) When the positions in the X, Y, and θ directions are determined, the probing stage 3 is moved upward by the elevating mechanism 24, and the upper flat surface of the probing stage 3 comes into contact with the bottom surface of the wafer W (c). A Z stage elevating mechanism 31 moves the Z stage 10 upward, so that the object to be tested comes into contact with the probes (d). In this state, at least one of the Z stage elevating mechanism 31 and probing stage elevating mechanism 24 is moved further upward, so that the wafer W is overdriven toward the probe card (e). In this state, the object to be tested is tested (f). When the test is ended, at least one of the Z stage elevating mechanism 31 and probing stage elevating mechanism 24 is moved downward to cancel overdriving. Furthermore, the Z stage elevating mechanism 31 moves the Z stage 10 downward to separate the object to be tested from the probes (g1). Subsequently, the elevating mechanism 24 moves the probing stage 3 slightly downward to separate the upper flat surface of the probing stage 3 from the bottom surface of the wafer (g2). Alignment is performed again for the next object to be tested. The next object to be tested is tested in accordance with the same procedure.

Alignment in the X, Y, and θ directions is not limited to the order described above, but can be performed starting with any direction. In the above method, overdriving is performed by moving the Z stage 10 upward. Alternatively, while the probing stage 3 is in contact with the wafer W and the object to be tested is in contact with the probes 26, the elevating mechanism 24 may move the probing stage 3 further upward, thus performing overdriving.

As the probing stage 3 is fixed to the stage base through the probing stage elevating mechanism, the test center of the probe card is always supported by the probing stage 3. Therefore, the tilt of the main chuck 6, which is an issue in the conventional prober, is prevented, and a stable probe test can be performed even for an object to be tested which is located on the periphery of the wafer.

FIGS. 7 to 9 show the main part of a prober 100 according to the fourth embodiment of the present invention. In the fourth embodiment, a mechanism to control the temperature of an object to be tested is provided to a probing stage 3 of the prober 100 of the third embodiment. The probing stage 3 according to this embodiment can have a heater 18 under its upper surface, and can also have a temperature sensor 19 and heat exchanger 20. The heater 18 and heat exchanger 20 respectively heat and cool a plurality of objects to be tested with which a plurality of probes 26 of a probe card 14 come into contact. The temperature sensor measures the temperature of a predetermined object to be tested. The predetermined object to be tested is preferably an individual object to be tested with which each probe is in contact. In the same manner as in the first and second embodiments, the prober according to this embodiment also has a temperature controller 27. The temperature controller 27 controls the hater and heat exchanger on the basis of the detection result of the temperature sensor 19, so that the object to be tested or heater 18 is set to a predetermined temperature.

The heater 18 provided to the probing stage 3 can include one or a plurality of heaters 18. When a plurality of heaters are provided, they can have cell structures 9 in the same manner as in the second embodiment. Both the temperature sensor 19 and heat exchanger 20 can be provided in the same numbers as that of the heaters 18. The upper flat surface of the probing stage 3 preferably has a size substantially the same as that of one object to be tested or a group of the plurality of objects to be tested that are to be tested at once. With this arrangement, the temperature of only the object which is to be tested can be controlled, and the time required for increasing the temperature of the object to be tested can be shortened. Also, energy consumption and loss can be decreased.

The probing stage 3 can be made of a metal having high thermal conductivity such as aluminum, and is detachably attached to a probing stage elevating mechanism. Accordingly, the probing stage 3 can be exchanged for one having an appropriate size for each test target. When the probing stage 3 is to be exchanged, it can be exchanged together with a nut member 24c fixed to it, or it can be removed from the nut member 24c.

Figure 15:
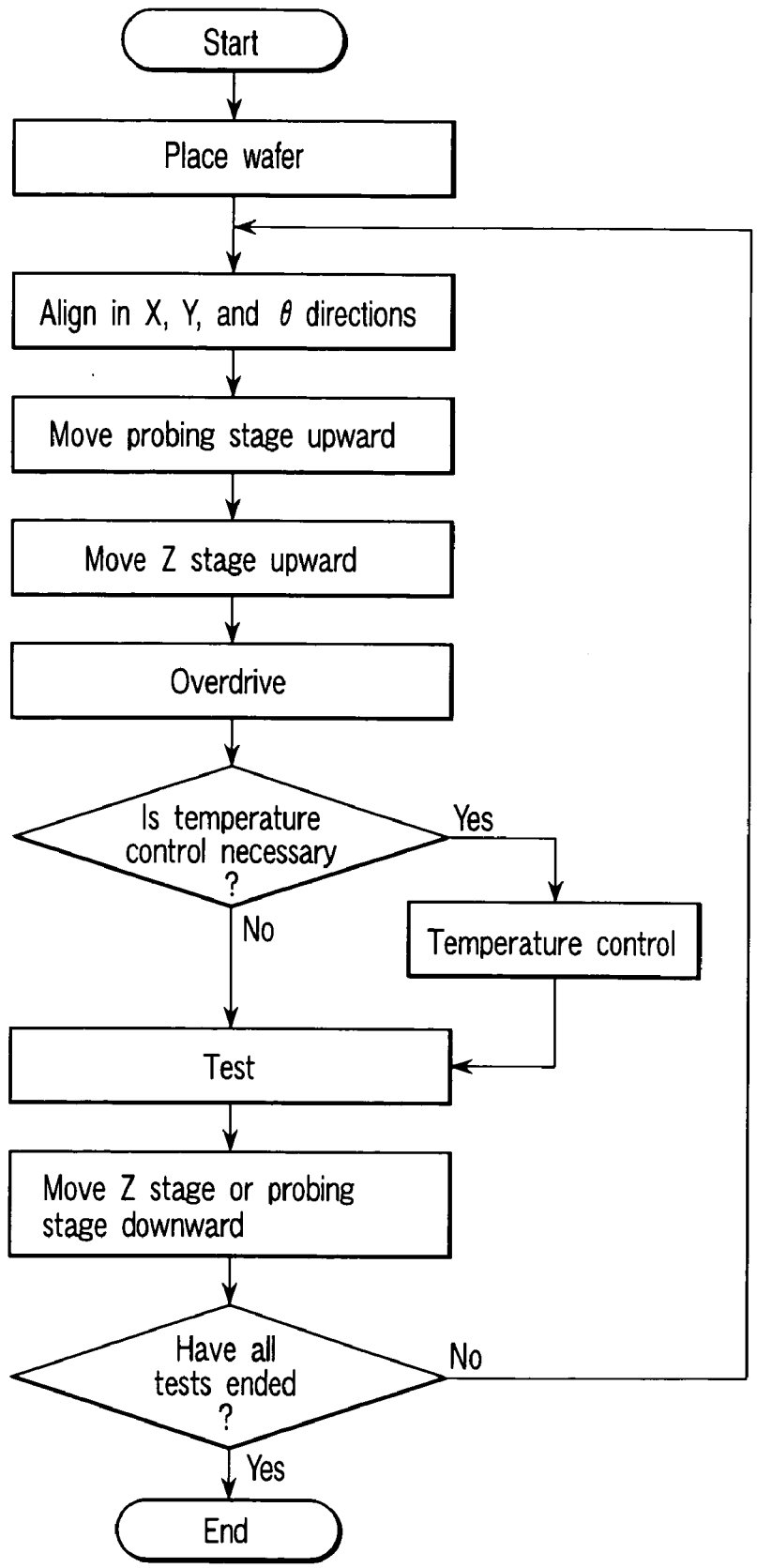
FIG. 15 is a flowchart for testing an object to be tested by using a prober according to an embodiment of the present invention.

The operation of the fourth embodiment will be described on the basis of the operation of the third embodiment. After the step (e) of overdriving a wafer W toward the probe card, the object to be tested is heated to and maintained at a predetermined temperature by the heater, temperature sensor, and heat exchanger provided to the probing stage 3 (T). Temperature control of the object to be tested may alternatively be performed before the step (e) of overdriving. After the temperature of the object to be tested reaches a predetermined temperature, the electrical characteristics of the object to be tested are tested (f). The operations of the third and fourth embodiments are shown in the flow chart of FIG. 15.

In the probing stage 3 as that of the above embodiment, the size of the upper flat surface is limited compared to that in the conventional main chuck. Thus, excellent advantages can be provided easily, e.g., the flat surface has small warp or deflection, facilitating the manufacture and use. Also, variations in the temperature distribution on the surface of the probing stage 3 can be decreased easily. Furthermore, in the above embodiment, as the volume of the probing stage 3 is comparatively small and the number of heaters is small, heat loss is suppressed when heating the object to be tested, so that the object to be tested can be heated quickly. When the object to be tested is to be cooled, quick cooling of the object to be tested without being interfered with by the heat inertia can be facilitated.

According to the embodiment of the present invention, a prober can be provided in which a main chuck includes a plurality of heaters having sizes appropriate for heating the respective objects to be tested, temperature sensors, heat exchangers, and a temperature controller, so that efficient temperature control of the object to be tested is facilitated.

According to the embodiment of the present invention, a prober can be provided in which a plurality of heaters are arranged to correspond to either a plurality of objects to be tested respectively, or a group including a plurality of objects to be tested among the plurality of objects to be tested, so that efficient temperature control of the object to be tested is facilitated.

According to the embodiment of the present invention, a prober can be provided in which a plurality of heaters have either cell structures respectively corresponding to a plurality of objects to be tested, or cell structures corresponding to a group including a plurality of objects to be tested among the plurality of objects to be tested, and a temperature controller controls the temperatures of the respective cells, so that efficient temperature control of the object to be tested is facilitated.

According to the embodiment of the present invention, a prober can be provided in which cell structures include insulators to partition respective cells from each other, so that efficient temperature control of the object to be tested without readily adversely affected by the temperature of an adjacent cell is facilitated.

According to the embodiment of the present invention, a prober can be provided in which an X-Y stage having a space at its center and including an X-Y moving mechanism, a substrate fixing mechanism, and a probing stage, eliminate the tilt of a main chuck, so that even an object to be tested which is located on the periphery of a wafer can be tested easily.

According to the embodiment of the present invention, a prober can be provided in which a probing stage includes a heater, heat exchanger, and temperature controller, so that the tilt of a main chuck is eliminated, even an object to be tested which is located on the periphery of a wafer can be tested stably, and efficient temperature control of the object to be tested is facilitated.

According to the embodiment of the present invention, a prober can be provided in which the upper surface of a probing stage has a size corresponding to the size of one object to be tested, so that efficient temperature control of the object to be tested is facilitated.

According to the embodiment of the present invention, a probing stage is exchangeable, so that selection of a probing stage suitable for a test target is facilitated.

What is claimed is:

1. A prober for testing a plurality of objects to be tested which are arranged on a wafer-like substrate under temperature control, comprising:
   a prober chamber;
   a stage base arranged in the prober chamber;
   an X-Y stage arranged on the stage base, the X-Y stage including an X-Y stage driving mechanism to move the X-Y stage at least in the X-Y direction;
   a Z stage arranged on the X-Y stage, the Z stage including a Z stage elevating mechanism to vertically move the Z stage;
   a main chuck arranged on the Z stage, the main chuck including:
      a rotational driving mechanism to rotate the main chuck in the θ direction,
      a plurality of heaters, said plurality of heaters respectively having sizes suitable to heat either one object to be tested or a group of objects to be tested, and said plurality of heaters respectively including temperature sensors, and
      a heat exchanger which cools the objects to be tested which are heated by said plurality of heaters; and
   a temperature controller which controls at least either the heaters or heat exchanger on the basis of the detection results of the temperature sensors,
   wherein said plurality of heaters have either cell structures respectively corresponding to one object to be tested, or cell structures respectively corresponding to the group of objects to be tested,
   the cell structures include individual heat exchangers, and
   the temperature controller controls at least either the heaters or heat exchanger, thus controlling the temperatures of the cell structures.

2. A prober according to claim 1, wherein the plurality of cell structures include heat insulators to partition respective cells from each other.

3. A prober according to claim 2, wherein
   the main chuck is arranged on the Z stage through a θ stage, and
   the rotational driving mechanism rotates the main chuck in the θ direction on the θ stage.

4. A prober for testing a plurality of objects to be tested which are arranged on a wafer-like substrate, comprising:
   a prober chamber;
   a stage base arranged in the prober chamber;
   a Z stage arranged on the stage base, the Z stage including a Z stage elevating mechanism to vertically move the Z stage;
   an X-Y stage arranged on the Z stage, the X-Y stage forming a first frame structure and having a first space at the center thereof, the X-Y stage including an X-Y driving mechanism to move the X-Y stage at least in the X and Y directions;

a substrate fixing mechanism arranged on the X-Y state, the substrate fixing mechanism forming a second frame structure and having a second space, at the center thereof, which is continuous to the first space;

a probe card arranged in the probe chamber to oppose the wafer-like substrate and having a plurality of probes;

a probing stage elevating mechanism fixed on the Z stage; and a probing stage attached to the probing stage elevating mechanism and arranged in the first space, wherein:

the probing stage being arranged such that an axis thereof coincides with an extension line vertically extending from the probe center of the probe card, and an upper flat surface of the probing stage has a size smaller than the size of the first and second space, and the upper flat surface serving to come into contact with the bottom surface of the substrate, when the probing stage is moved upward by the probing elevating mechanism, to support the substrate from below, wherein the substrate fixing mechanism includes a chuck plate, chuck plate fixing mechanism, and rotational driving mechanism to rotate the chuck plate fixing mechanism in the $\theta$ direction, and the chuck plate includes at least one of a plurality of fixing mechanisms to fix the substrate, a mechanism that draws and fixes the substrate by suction, and a ring mechanism to retain the substrate.

* * * * *

UNITED STATES PATENT AND TRADEMARK OFFICE
CERTIFICATE OF CORRECTION

PATENT NO. : 6,992,500 B2  Page 1 of 1
APPLICATION NO. : 10/869932
DATED : January 31, 2006
INVENTOR(S) : Masahiko Sugiyama et al.

It is certified that error appears in the above-identified patent and that said Letters Patent is hereby corrected as shown below:

On the title page, Item (73), the Assignee information is incorrect. Item (73) should read:

-- (73) Assignee: Tokyo Electron Limited, Tokyo (JP) --

Signed and Sealed this

Twenty-fifth Day of December, 2007

JON W. DUDAS
*Director of the United States Patent and Trademark Office*